United States Patent [19]
Chen et al.

[11] Patent Number: 5,659,499
[45] Date of Patent: Aug. 19, 1997

[54] MAGNETIC MEMORY AND METHOD THEREFOR

[75] Inventors: Eugene Chen, Gilbert; Saied N. Tehrani, Tempe; Mark Durlam, Chandler; Xiaodong T. Zhu, Chandler, all of Ariz.

[73] Assignee: Motorola, Schaumburg, Ill.

[21] Appl. No.: 562,482

[22] Filed: Nov. 24, 1995

[51] Int. Cl.⁶ .................................................. G11C 11/00
[52] U.S. Cl. .............................. 365/158; 365/97; 365/173
[58] Field of Search ........................... 365/158, 97, 173

[56] References Cited

U.S. PATENT DOCUMENTS 4,780,848  10/1988  Daughton et al. ................. 365/158 X
5,039,655  8/1991   Pisharody .......................... 365/161 X
5,343,422  8/1994   Kung et al. .

*Primary Examiner*—David C. Nelms
*Assistant Examiner*—Huan Hoang
*Attorney, Agent, or Firm*—Eugene A. Parsons

[57] ABSTRACT

A magnetic memory utilizes a magnetic material to concentrate a magnetic field in a magnetic memory cell element. The magnetic material reduces the amount of current required to read and write the magnetic memory.

3 Claims, 3 Drawing Sheets

MAGNETIC MEMORY AND METHOD THEREFOR

BACKGROUND OF THE INVENTION

The present invention relates, in general, to magnetoresistive materials, and more particularly, to a novel memory using magnetoresistive materials.

In the past, a variety of magnetoresistive materials have been utilized to form non-volatile memories. Typically, such memories utilize an anisotropic magnetoresistive (AMR) or giant magnetoresistive (GMR) multilayer magnetic element as a basic memory cell element. The basic memory cell element is covered with a dielectric, and a word conductor or word line crosses the dielectric at right angles to the basic memory cell element. One problem with the prior memory is power dissipation. In order to produce a magnetic field that was sufficient to read or write the memory, a large current is required which results in high power dissipation (typically greater than 50 milliwatts/bit).

Because of the large magnetic fields (typically greater than approximately 50 oersteds) created from the large current, it is necessary to have a large distance (typically greater than the length of the memory cell) between each memory cell in order to prevent the large magnetic field from affecting nearby memory cells.

Accordingly, it is desirable to have a magnetic memory that has low power dissipation (less than 50 milliwatts/bit), that does not affect nearby memory cells when reading or writing a particular memory cell, and that does not require a large distance between memory cells.

DETAILED DESCRIPTION OF THE DRAWINGS

Figure 1:
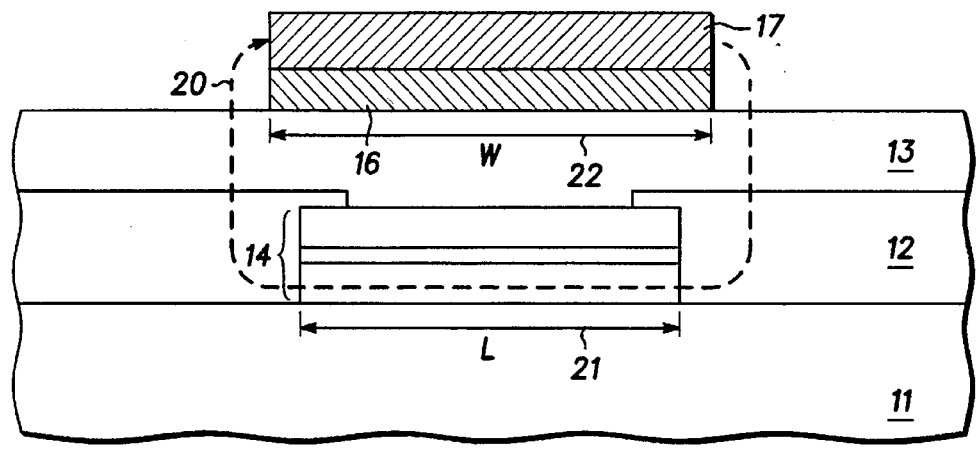
FIG. 1 illustrates an enlarged cross-sectional portion of a magnetic memory in accordance with the present invention.

FIG. 1 illustrates an enlarged cross-sectional portion of a magnetic memory array or magnetic memory having a magnetic memory cell 10. The memory and cell 10 include a substrate 11 on which other portions of cell 10 are formed. Magnetic memory cell 10 includes a magnetic memory cell element 14 in which information is stored in the form of magnetization vectors within element 14. In the preferred embodiment, element 14 is a multi-layer giant magnetoresistive (GMR) material that is well known to those skilled in the art. As shown in FIG. 1, element 14 has a length 21, shown by an arrow, and a width that is oriented perpendicular to the page. A shorting bar or column conductor 12 is utilized to connect element 14 in a column with other memory cells. A dielectric 13 covers element 14 and conductor 12 in order to insulate element 14 from a word line conductor 16. Conductor 16 has a width 22, shown by an arrow, and a length that is perpendicular to the page and extends across the memory. Conductor 16 overlays element 14 and generally extends substantially perpendicular to element 14. Width 22 typically is at least equal to length 21.

A top surface of conductor 16 is covered with a magnetic material 17. Material 17 has a high permeability that allows the magnetization direction of material 17 to change in response to a magnetic field created by conductor 16. The permeability of material 17 generally is higher than the permeability of element 14. A current generally is passed through conductor 16 to create the magnetic field. As the magnetic field created by conductor 16 increases, the strength of poles accumulated at each end of material 17 also increases due to the high permeability. Consequently, the magnetic field above or on the top surface of conductor 16 is substantially zero while a magnetic field 20, indicated by an arrow, surrounding the remainder of conductor 16 is increased by an amount equal to the amount that the magnetic field above or on the top surface of conductor 16 is reduced. As a result, magnetic field 20 is concentrated toward element 14 and away from the top surface or above the top surface of conductor 16.

This increase in the intensity of magnetic field 20 reduces the amount of current required to flow through conductor 16 in order to obtain a given magnetic field intensity within element 14. The reduction in current is directly proportional to the increased intensity of the magnetic field within element 14 as a result of magnetic material 17. It is believed that material 17 can reduce the current required to produce a given magnetic field value by about fifty per cent.

Material 17 typically is formed by performing a blanket deposition of conductor material that is utilized for conductor 16, followed by a blanket deposition of the material utilized for material 17 on top of the material utilized for conductor 16. Thereafter, a mask is patterned on top of the material utilized for material 17, and the undesired portions of both materials are removed leaving conductor 16 and material 17.

Figure 2:
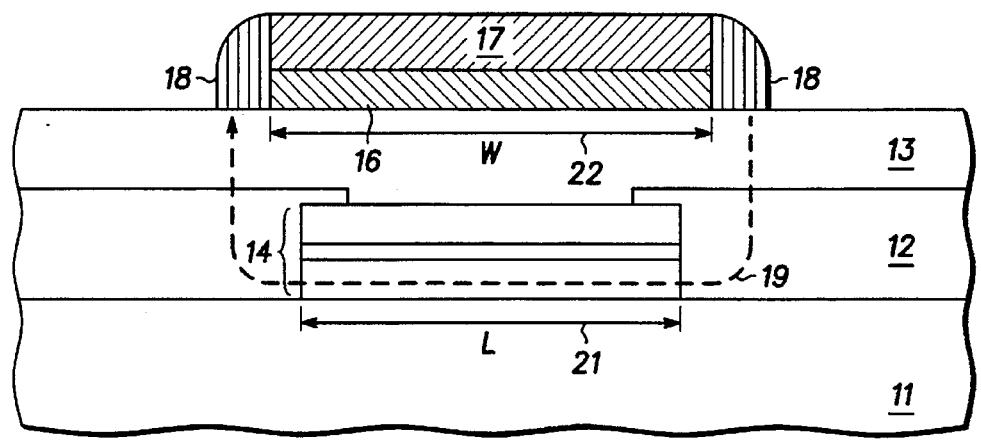
FIG. 2 illustrates an enlarged cross-sectional portion of an alternate embodiment of a magnetic memory in accordance with the present invention.

FIG. 2 illustrates an enlarged cross-sectional portion of a magnetic memory cell 25 that is an alternate embodiment of memory 10 shown in FIG. 1. Portions of FIG. 2 that have the same reference numbers as FIG. 1 are the same as the corresponding FIG. 1 elements. A magnetic material 18 is formed by extending material 17 over the sides of conductor 16. Magnetic material 18 concentrates a magnetic field 19, shown by an arrow, away from the sides of conductor 16 and into element 14. This increases the intensity of field 19 by an amount equal to the intensity of the magnetic field concentrated away from the sides by material 18 and away from the top by material 17.

This increase in the intensity of magnetic field 19 reduces the amount of current required to flow through conductor 16 in order to obtain a given magnetic field intensity within element 14. The reduction in current is directly proportional to the increased intensity of the magnetic field within element 14 as a result of magnetic material 17 and magnetic material 18. It is believed that materials 17 and 18 can reduce the current required to produce a given magnetic field value by over fifty per cent.

Material 18 typically is formed by first forming conductor 16 and material 17. Then, the material utilized for material 18 is blanket deposited on top of material 17 and dielectric 13. A reactive ion etch is subsequently used to remove the material on top of conductor 16 and on top of dielectric 13 while leaving material 18 on the sides of conductor 16 and extending up to contact material 17.

Figure 3:
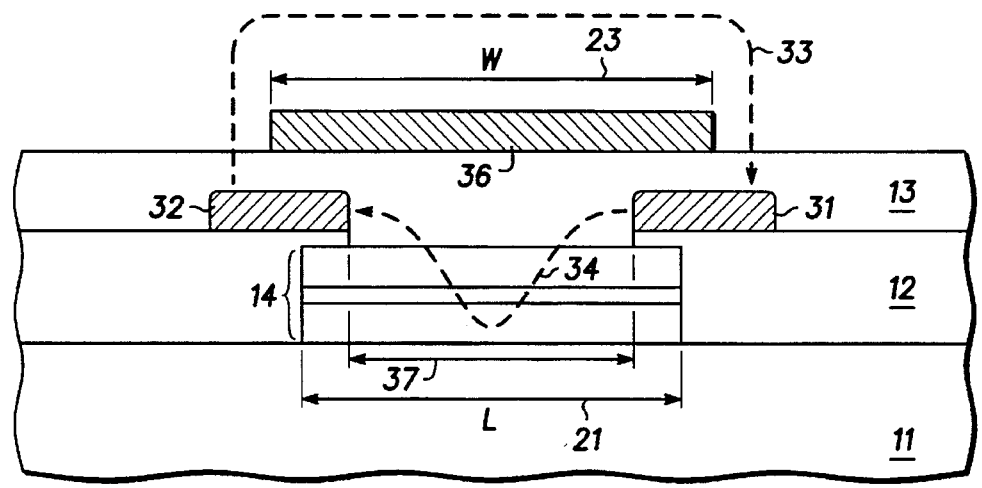
FIG. 3 illustrates an enlarged cross-sectional portion of another alternate embodiment of a magnetic memory in accordance with the present invention.

FIG. 3 illustrates an enlarged cross-sectional portion of a magnetic memory cell 30 that is an alternate embodiment of cell 10 shown in FIG. 1. Portions of FIG. 1 that have the same reference numbers as FIG. 1 are the same as the corresponding FIG. 1 elements. Cell 30 has a word line conductor 36 that is similar to conductor 16. However, conductor 36 may have width 23 that is larger than width 22 as will be seen hereinafter. A magnetic material 31 and a magnetic material 32 are formed on top of conductor 12 and generally overlap a portion of element 14. Materials 31 and 32 are formed at opposite ends of length 21 of element 14 so that a gap 37, shown by an arrow, is formed overlying element 14 and positioned between conductor 36 and element 14. Dielectric 13 is formed on top of materials 31 and 32. Consequently, a portion of dielectric 13 is between conductor 36 and materials 31 and 32 so that materials 31 and 32 are adjacent to conductor 36.

Materials 31 and 32 increase the intensity of magnetic fields 33 and 34, shown by arrows, formed by conductor 36 by an amount equal to the amount that materials 31 and 32 concentrate the magnetic field away from conductor 36. Gap 37 concentrates field 34 in element 14. Gap 37 has a width that is less than length 21 to assist concentrating field 34 in element 14. Width 23 generally is larger than length 21 in order to ensure that conductor 36 overlaps materials 31 and 32 so that field 33 reacts with materials 31 and 32.

Figure 4:
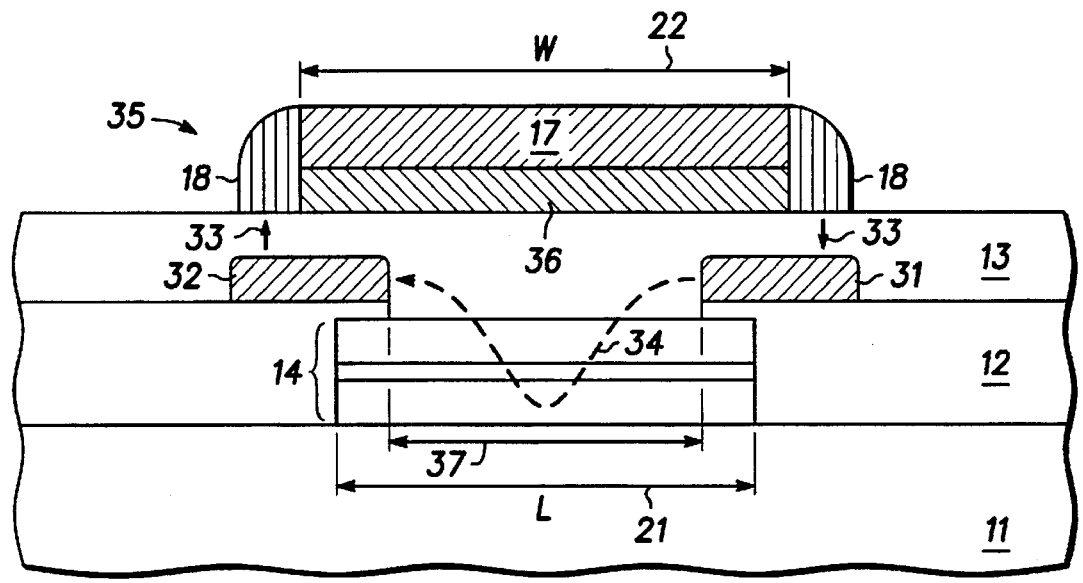
FIG. 4 illustrates an enlarged cross-sectional portion of another alternate embodiment of a magnetic memory in accordance with the present invention.

FIG. 4 illustrates an enlarged cross-sectional portion of a magnetic memory cell 35 that is an another alternate embodiment of cell 10 shown in FIG. 1 and cell 30 shown in FIG. 3. Portions of FIG. 4 that have the reference numerals as FIGS. 1 and 3 are the same as the corresponding FIG. 1 and 3 elements. Because materials 31 and 32 are quite short, the increased intensity resulting from materials 31 and 32 is small when materials 31 and 32 are used alone. However, when materials 31 and 32 are used together with materials 17 and 18, gap 37 concentrates the resulting magnetic field into element 14. This resulting magnetic field is increased by the amount of the magnetic field concentrated away from above the top surface, the sides, and from a portion of the bottom of conductor 36.

Figure 5:
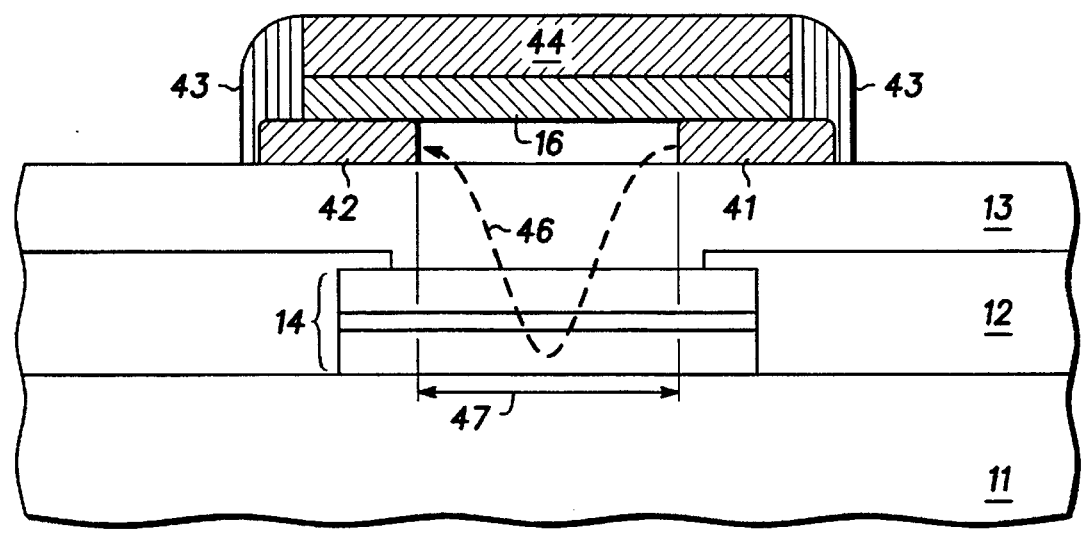
FIG. 5 illustrates an enlarged cross-sectional portion of another alternate embodiment of a magnetic memory in accordance with the present invention.

FIG. 5 illustrates an enlarged cross-sectional portion of a magnetic memory cell 40 that is an another alternate embodiment of cell 10 shown in FIG. 1 and cell 30 shown in FIG. 3. Portions of FIG. 4 that have the reference numerals as FIGS. 1 and 3 are the same as the corresponding FIGS. 1 and 3 elements. Cell 40 has a magnetic material 41 and a magnetic material 42 formed on dielectric 13. Materials 41 and 42 function similar to materials 31 and 32 shown in FIG. 3. Conductor 16 is formed on materials 41 and 42. A magnetic material 44 is formed on a top surface of conductor 16, and functions similar to material 17 shown in FIG. 1. A magnetic material 43 is formed along the sides of conductor 16 and functions similar to material 18 shown in FIG. 2. Materials 41, 42, 43, and 44 create a gap 47 that functions to concentrate a magnetic field 46, shown by an arrow, created by conductor 16 away from the top, sides, and a portion of the bottom of conductor 16 and concentrates magnetic field 46 in element 14.

Figure 6:
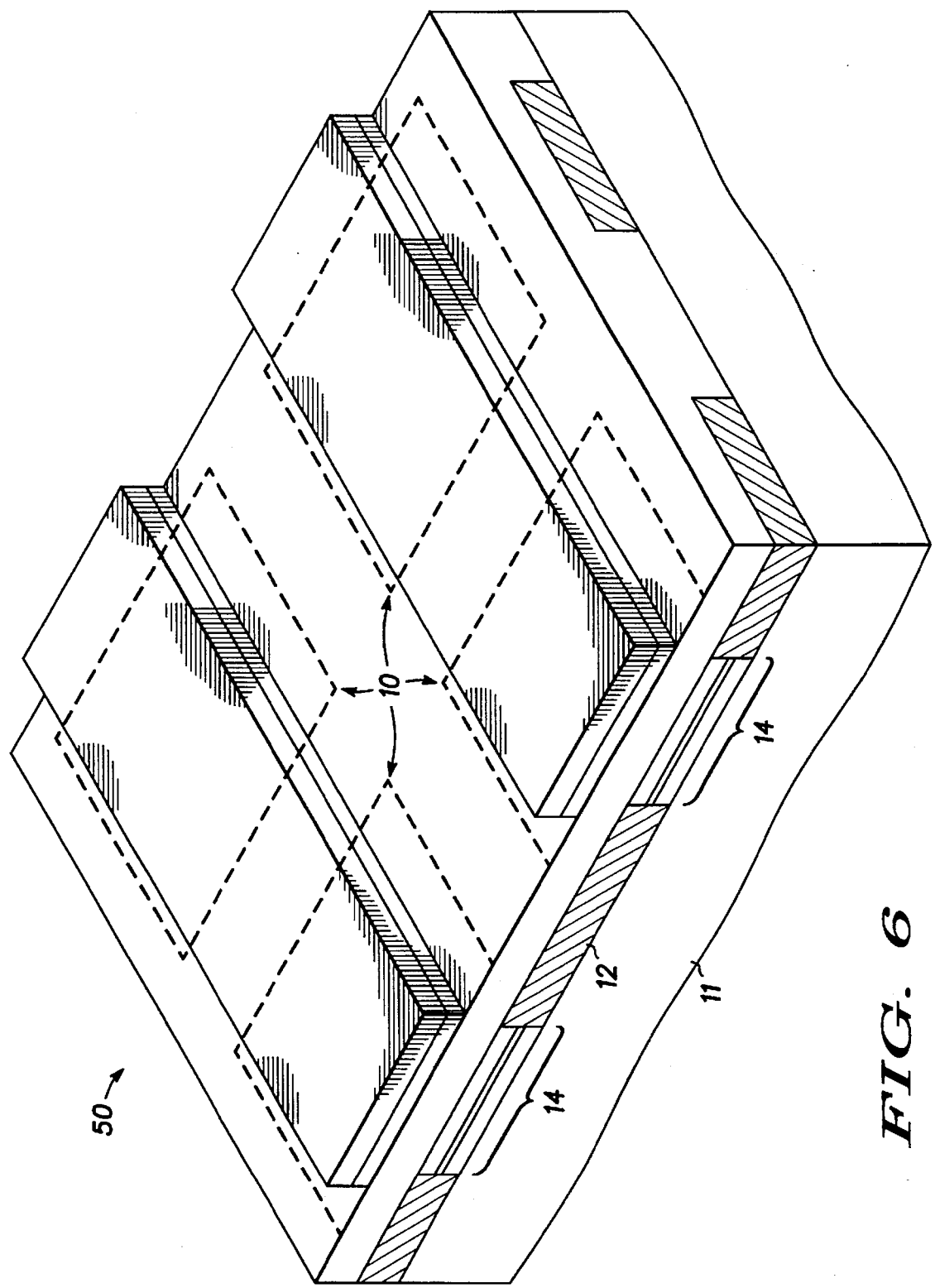
FIG. 6 illustrates an enlarged cross-sectional portion of a magnetic memory array in accordance with the present invention.

FIG. 6 illustrates an enlarged cross-sectional portion of a magnetic memory array or magnetic memory 50 that utilizes magnetic memory cell 10 shown in FIG. 1. Portions of FIG. 5 that have the reference numerals as FIGS. 1 and 2 are the same as the corresponding FIGS. 1 and 2 elements. Memory 50 includes a plurality of cells 10, shown by dashed boxes, that are explained in the discussion of FIG. 1. Memory 50 could also utilize cell 25 from FIG. 2 or cell 30 from FIG. 3 or cell 35 from FIG. 4 or cell 40 from FIG. 5.

It should be noted that cells 10, 25, 30, 35, and 40 could also include a digit line that assists in creating the magnetic field when the current is too large for the word or sense conductors. The digit line typically is on top of and perpendicular to the word conductor, but it could also be under the magnetic memory cell element. The magnetic material, such as material 17, could also be around the digit line in addition to or instead of conductor 16.

By now, it should be appreciated that a novel magnetic memory cell has been provided. By concentrating the magnetic field away from conductor 16 and concentrating the magnetic field in element 14, the amount of current required to produce the magnetic field is reduced. Reducing the required current reduces the amount of power dissipated by the memory. Additionally, the magnetic material elements function to reduce the effect of the magnetic field created by adjacent magnetic memory cells. This shielding effect allows the memory cells to be placed closer together without having the memory cells disturbed by the magnetic field of adjacent memory cells.

We claim:

1. A method of forming a magnetic memory comprising:
    forming an elongated conductor having a width and overlying a magnetic memory cell element; and
    concentrating a magnetic field created by the conductor away from a portion of the conductor and toward the magnetic memory cell element to extend into a gap narrower than the width of the conductor wherein the gap is between the conductor and the magnetic memory cell element and wherein the magnetic field extends into the magnetic memory cell element.

2. The method of forming a magnetic memory as claimed in claim 1 further including a step of forming the gap by plating magnetic material under the conductor and between the conductor and a dielectic.

3. The method of forming a magnetic memory as claimed in claim 1 further including a step of forming the gap by placing magnetic material under the conductor and between the magnetic memory cell element and a dielectric.

* * * * *

UNITED STATES PATENT AND TRADEMARK OFFICE
CERTIFICATE OF CORRECTION

PATENT NO. : 5,659,499
DATED : August 19, 1997
INVENTOR(S) : Eugene Chen et al.

It is certified that error appears in the above-indentified patent and that said Letters Patent is hereby corrected as shown below:

In Claim 2, column 4, line 50, delete "plating", insert --placing--.

Signed and Sealed this

Twenty-fifth Day of November, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.    : 5,659,499
DATED         : August 19, 1997
INVENTOR(S)   : Chen et al.

It is certified that error appears in the above-identified patent and that said Letters Patent is hereby corrected as shown below:

<u>Column 1,</u>
Line 3, after the Title, please add as a new first paragraph the following paragraph:
-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*